United States Patent
Zhang et al.

(10) Patent No.: US 12,417,736 B2
(45) Date of Patent: *Sep. 16, 2025

(54) DISPLAY PANEL AND DISPLAY DEVICE

(71) Applicant: Wuhan China Star Optoelectronics Semiconductor Display Technology Co., Ltd., Hubei (CN)

(72) Inventors: Jun Zhang, Hubei (CN); Tao Chen, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/626,399

(22) Filed: Apr. 4, 2024

(65) Prior Publication Data
US 2024/0274070 A1 Aug. 15, 2024

Related U.S. Application Data

(63) Continuation of application No. 17/602,787, filed as application No. PCT/CN2021/110354 on Aug. 3, 2021, now Pat. No. 11,978,395.

(30) Foreign Application Priority Data

Jul. 23, 2021 (CN) .......................... 202110838588.8

(51) Int. Cl.
*G09G 3/3225* (2016.01)
*G09G 3/3233* (2016.01)
*H10K 59/131* (2023.01)

(52) U.S. Cl.
CPC ......... *G09G 3/3225* (2013.01); *H10K 59/131* (2023.02); *G09G 2300/0842* (2013.01);
(Continued)

(58) Field of Classification Search
CPC .. G09G 3/3674; G09G 3/3659; G09G 3/3266; G09G 2310/062
See application file for complete search history.

(56) References Cited

U.S. PATENT DOCUMENTS 10,984,723 B1 * 4/2021 Zhou .................... G09G 3/3258
11,847,968 B1 * 12/2023 Peng .................... G09G 3/3275
(Continued)

FOREIGN PATENT DOCUMENTS

| CN | 109215573 A | 1/2019 |
| CN | 109584779 A | 4/2019 |

(Continued)

OTHER PUBLICATIONS

Chinese Office Action issued in corresponding Chinese Patent Application No. 202110838588.8 dated Feb. 7, 2022, pp. 1-7.
(Continued)

*Primary Examiner* — Sepehr Azari
(74) *Attorney, Agent, or Firm* — Nathan & Associates Patent Agents Ltd.; Menachem Nathan

(57) ABSTRACT

A display panel and a display device are disclosed. The display panel includes a display substrate, a plurality rows of first pixel driving circuits, a plurality rows of second pixel driving circuits, and a plurality of first reset signal lines; the plurality of reset signal lines comprises a plurality of first
(Continued)

reset signal lines and a plurality of second reset signal lines, each of the first reset signal lines is only electrically connected to one row of the first pixel driving circuits; each of the second reset signal lines is electrically connected to one row of the first pixel driving circuits and at least one row of the second pixel driving circuits.

20 Claims, 13 Drawing Sheets

(52) U.S. Cl.
CPC . *G09G 2300/0861* (2013.01); *G09G 2310/08* (2013.01); *G09G 2320/0233* (2013.01); *G09G 2320/0686* (2013.01)

(56) References Cited

U.S. PATENT DOCUMENTS

| | | | |
|---|---|---|---|
| 2019/0164489 A1* | 5/2019 | Zhang | G09G 3/3258 |
| 2020/0105201 A1* | 4/2020 | Li | G09G 3/3685 |
| 2020/0176542 A1* | 6/2020 | Park | G09G 3/3241 |
| 2020/0243562 A1 | 7/2020 | Liu et al. | |
| 2020/0365817 A1* | 11/2020 | Park | H10K 59/88 |
| 2021/0210005 A1* | 7/2021 | Zhou | G09G 3/325 |
| 2021/0233457 A1* | 7/2021 | Xiong | G09G 3/2074 |
| 2022/0139335 A1* | 5/2022 | Lee | G09G 3/3233 |
| 2023/0154374 A1* | 5/2023 | Yi | G09G 3/32 |
| | | | 345/205 |
| 2024/0046859 A1* | 2/2024 | Wang | H10K 59/131 |

FOREIGN PATENT DOCUMENTS

| | | |
|---|---|---|
| CN | 109638046 A | 4/2019 |
| CN | 110444125 A | 11/2019 |
| CN | 210515985 U | 5/2020 |
| CN | 111508377 A | 8/2020 |
| CN | 111708199 A | 9/2020 |
| CN | 111710239 A | 9/2020 |
| CN | 111816118 A | 10/2020 |
| CN | 112102783 A | 12/2020 |
| CN | 112490277 A | 3/2021 |
| CN | 112542121 A | 3/2021 |
| CN | 113011353 A | 6/2021 |
| JP | 2010230797 A | 10/2010 |

OTHER PUBLICATIONS

International Search Report in International application No. PCT/CN2021/110354, mailed on Feb. 25, 2022.
Written Opinion of the International Search Authority in International application No. PCT/CN2021/110354, mailed on Nov. 21, 2023.

* cited by examiner

DISPLAY PANEL AND DISPLAY DEVICE

CROSS-REFERENCE TO RELATED APPLICATIONS

This application is a continuation application of U.S. application Ser. No. 17/602,787, filed on Oct. 11, 2021, which is a US national phase application based upon an International Application No. PCT/CN2021/110354, filed on Aug. 3, 2021, which claims priority to Chinese Patent Application No. 202110838588.8 filed on Jul. 23, 2021. The entire disclosures of the above applications are incorporated herein by reference.

BACKGROUND OF DISCLOSURE

Field of Disclosure

The present disclosure relates to a field of display technology, in particular to a display panel and a display device.

Description of Prior Art

With development of industry of portable electronic devices (such as mobile phones, tablets, e-books, and navigation devices), camera under panel (CUP) technology, which brings better visual enjoyment and interference-free all-round display, has gradually become a trend of development.

A current CUP display device refers to a display device that can be displayed by a display panel corresponding to a camera position. When not taking pictures, it can display screen content normally; when taking pictures, good light transmittance can meet lighting requirements of a camera. A CUP display panel in the prior art comprises a display area corresponding to a camera (abbreviated as an imaging area under panel) and a conventional display area corresponding to left and right sides of the imaging area under panel. In order to improve light transmittance of the CUP display panel in the imaging area under panel, the prior art makes a number of rows of pixel driving circuits in the imaging area under panel for driving pixels in the imaging area under panel less than a number of rows of the pixel driving circuits in the conventional display area for driving pixels in the conventional display area. Each row of the pixel driving circuits in the conventional display area needs to be electrically connected to a signal line of a fixed signal type to access electrical signals, and the signal line will extend to the imaging area under panel and be electrically connected to the pixel driving circuits in the imaging area under panel, which makes a row of pixel driving circuits in the imaging area under panel need to be electrically connected to a plurality of signal lines of the conventional display area. This wiring design will make inconsistency of resistance-capacitance loading between the conventional display area and the camera area under panel, which causes the display panel to appear horizontal mura in a low gray-scale mode, resulting in uneven display.

SUMMARY OF DISCLOSURE

Embodiments of the present disclosure provide a display panel and a display device, which can solve a problem of inconsistent resistance and capacitance loading of a reset signal line in an imaging area under panel and a conventional display area.

In one aspect, the present disclosure provides a display panel, including: a display substrate including a first display area and a second display area adjacent to the first display area; a pixel unit including first pixel units located in the first display area and second pixel units located in the second display area; a pixel driving circuit including a plurality of first pixel driving circuits electrically connected to the first pixel units and a plurality of second pixel driving circuits electrically connected to the second pixel units, the plurality of first pixel driving circuits are arranged in a plurality of rows of first pixel driving circuits in the first display area, and the plurality of second pixel driving circuits are arranged in a plurality of rows of second pixel driving circuits in the second display area; and a plurality of reset signal lines electrically connected to the plurality of rows of the first pixel driving circuits in a one-to-one correspondence. Each of the rows of the first pixel driving circuits is electrically connected to a same reset signal line, and each of the rows of the second pixel driving circuits is electrically connected to a same reset signal line. The plurality of reset signal lines include a plurality of first reset signal lines and a plurality of second reset signal lines, each of the first reset signal lines is electrically connected to only one row of the first pixel driving circuits; and each of the second reset signal lines is electrically connected to one row of the first pixel driving circuits and at least one row of the second pixel driving circuits.

In another aspect, the present disclosure provides a display device, wherein the display device comprises a light sensing element and a display panel, and the display panel includes: a display substrate including a first display area and a second display area adjacent to the first display area; a pixel unit including first pixel units located in the first display area and second pixel units located in the second display area; a pixel driving circuit including a plurality of first pixel driving circuits electrically connected to the first pixel units and a plurality of second pixel driving circuits electrically connected to the second pixel units, the plurality of first pixel driving circuits are arranged in a plurality of rows of first pixel driving circuits in the first display area, and the plurality of second pixel driving circuits are arranged in a plurality of rows of second pixel driving circuits in the second display area; and a plurality of reset signal lines electrically connected to the plurality of rows of the first pixel driving circuits in a one-to-one correspondence. Each of the rows of the first pixel driving circuits is electrically connected to a same reset signal line, and each of the rows of the second pixel driving circuits is electrically connected to a same reset signal line. The plurality of reset signal lines include a plurality of first reset signal lines and a plurality of second reset signal lines, each of the first reset signal lines is electrically connected to only one row of the first pixel driving circuits; and each of the second reset signal lines is electrically connected to one row of the first pixel driving circuits and at least one row of the second pixel driving circuits, and the light sensing element is disposed on one side of the display panel corresponding to the second display area.

DESCRIPTION OF DRAWINGS

In order to more clearly explain technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DETAILED DESCRIPTION OF EMBODIMENTS

Figure 1:
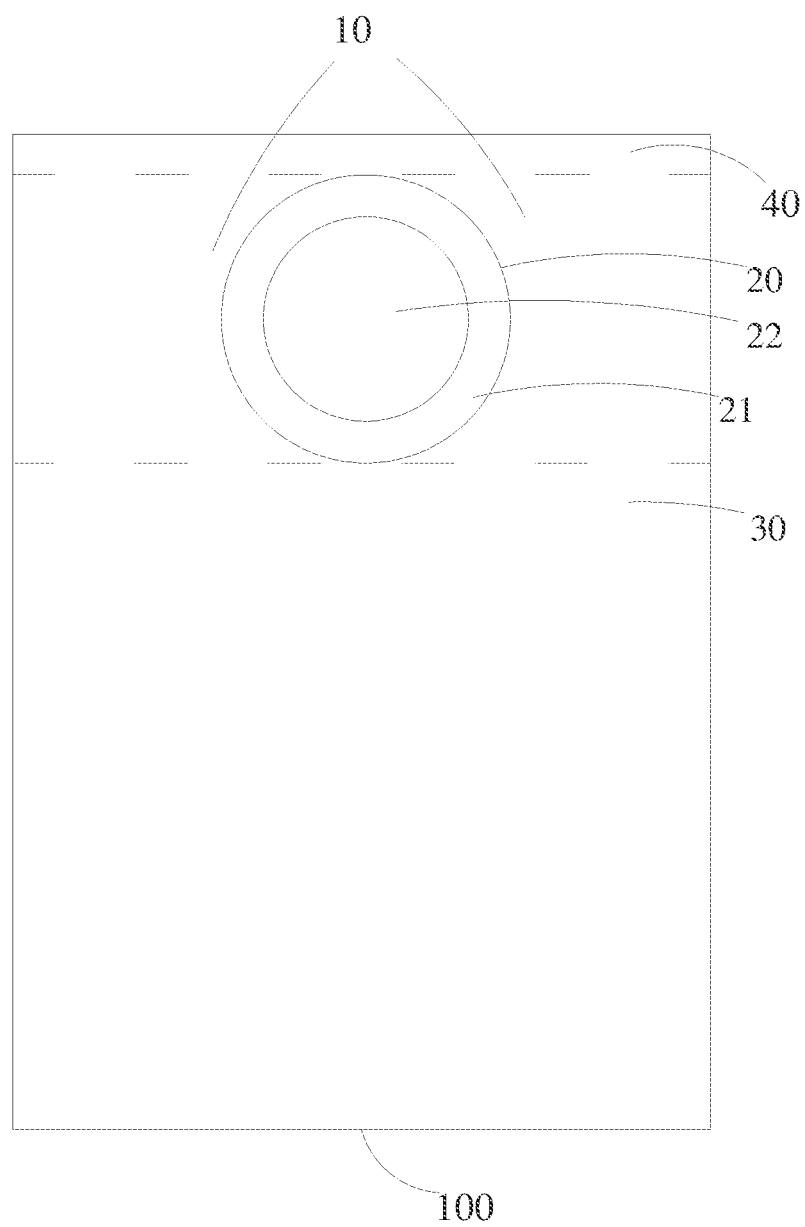
FIG. 1 shows a schematic structural diagram of a display substrate provided by an embodiment of the present disclosure.

Technical solutions in the embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure. In addition, it should be understood that specific implementations described here are only used to illustrate and explain the present disclosure, and are not used to limit the present disclosure. In the present disclosure, unless otherwise stated, directional words used such as "upper" and "lower" generally refer to upper and lower directions of a device in actual use or working state, and specifically refer to drawing directions in the drawings. In addition, "inner" and "outer" refer to an outline of the device.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and/or reference letters may be repeated in different examples. This repetition is for purposes of simplicity and clarity and does not indicate a relationship of the various embodiments and/or the settings. Furthermore, the present disclosure provides specific examples of various processes and materials, however, disclosures of other processes and/or other materials may be appreciated those skilled in the art. The following detailed descriptions are made separately. It should be noted that an order of description in the following embodiments is not intended to limit a preferred order of the embodiments.

Embodiment One

A first embodiment of the present disclosure provides a display panel. A type of the display panel may be an organic light-emitting diode (OLED) display panel with a light-emitting unit being an organic light-emitting diode, or a mini light-emitting diode (Mini-LED) or a micro light-emitting diode (Micro-LED) display panel with a light-emitting unit being a micro light-emitting diode. The following uses the OLED display panel as an example for illustration.

In this embodiment, the display panel comprises: a display substrate which may be a flexible display substrate or a rigid display substrate, and materials of the display substrate may be one or more of glass, plastic, silicon dioxide, polyethylene, polypropylene, polystyrene, polylactic acid, polyethylene terephthalate, polyimide, or polyurethane.

FIG. 1 shows a schematic structural diagram of a display substrate 100 provided by an embodiment of the present disclosure. As shown in FIG. 1, the display substrate 100 comprises a display area. The display area comprises, for example, a first display area 10 and a second display area 20 adjacent to the first display area 10. The first display area 10, for example, is located on left and right sides of the second display area 20. The display area, for example, further comprises a third display area 30 and a fourth display area 40 located on both sides of the first display area 10 and the second display area 20. The display substrate 100 further comprises, for example, a non-display area (not shown in the figure), and the non-display area may be disposed on a periphery of the display area.

In this embodiment, the first display area 10 is, for example, a conventional display area, and the second display area 20 is, for example, an area corresponding to a light sensing element, and the light sensing element is disposed on a side of the display substrate 100. The light sensing element is, for example, a camera or a light sensor, and the second display area 20 can display images together with the first display area 10 when performing a display function, thereby increasing a screen-to-body ratio of the display panel, and when the display area 20 performs a light-transmitting function, external ambient light can be better incident on the light sensing element located on the side of the display substrate 100, so that the light sensing element can operate normally.

In this embodiment, the display panel comprises a plurality rows of pixel driving circuits disposed on the display substrate 100, and the plurality rows of pixel driving circuits comprise a plurality rows of first pixel driving circuits located in the first display area 10 and a plurality rows of second pixel driving circuits located in the second display area 20, and a number of rows of the first pixel driving circuit is greater than a number of rows of the second pixel driving circuit. The present disclosure reduces a number of rows of pixel driving circuits in the second display area, which can effectively reduce a light-shielding area of the second display area 20 and increase light transmittance of the second display area 20.

In this embodiment, each row of the first pixel driving circuits in the first display area 10 comprises a plurality of first pixel driving circuits, and the first pixel driving circuits are arranged in an array in the first display area 10. The first pixel driving circuits in the first display area 10 on the left side of the second display area 20 and the first pixel driving circuits in the first display area 10 on the right side of the second display area 20 can be symmetrical relative to a central axis of the second display area 20.

Figure 2:
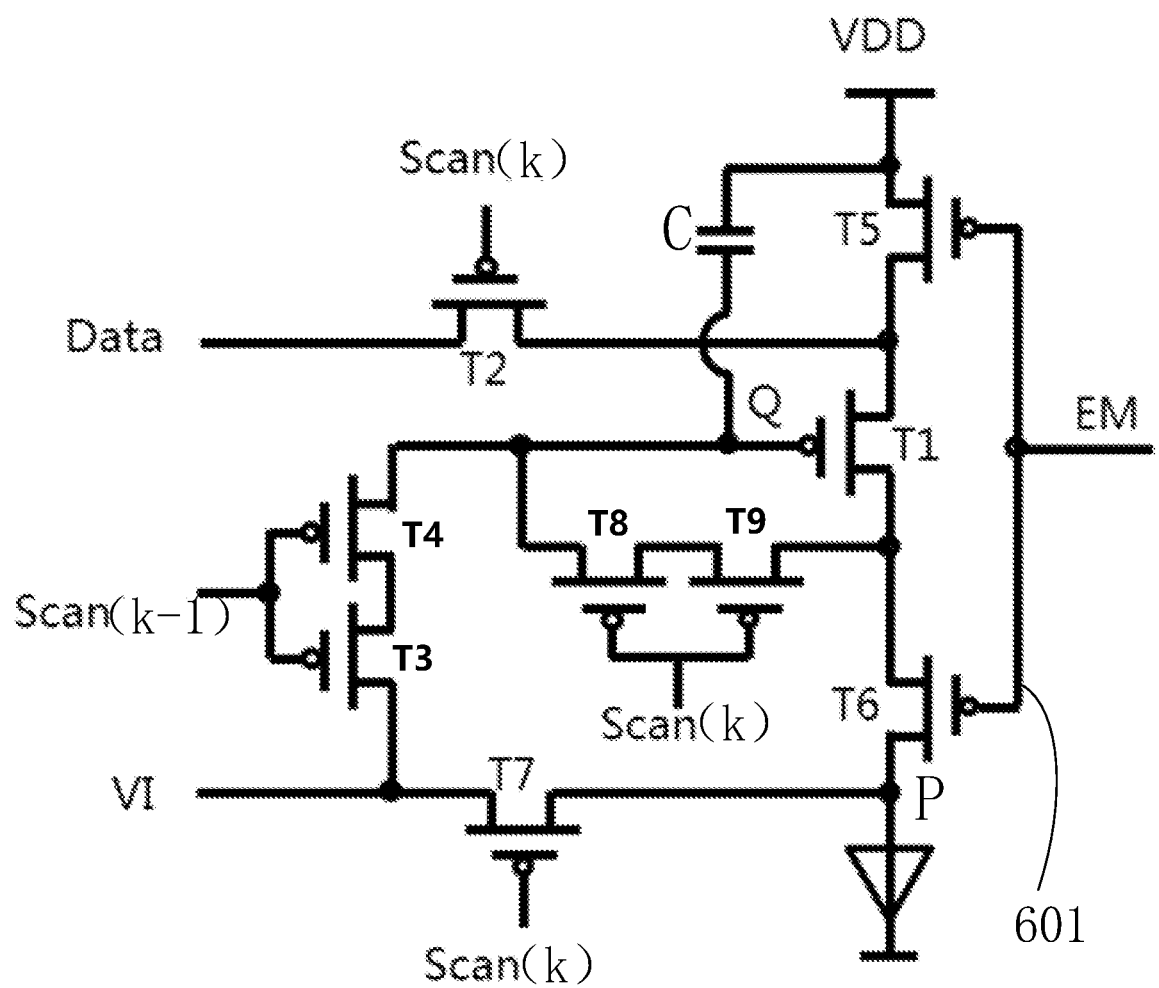
FIG. 2 shows a schematic diagram of an equivalent circuit of a first pixel driving circuit provided by an embodiment of the present disclosure.
Figure 3:
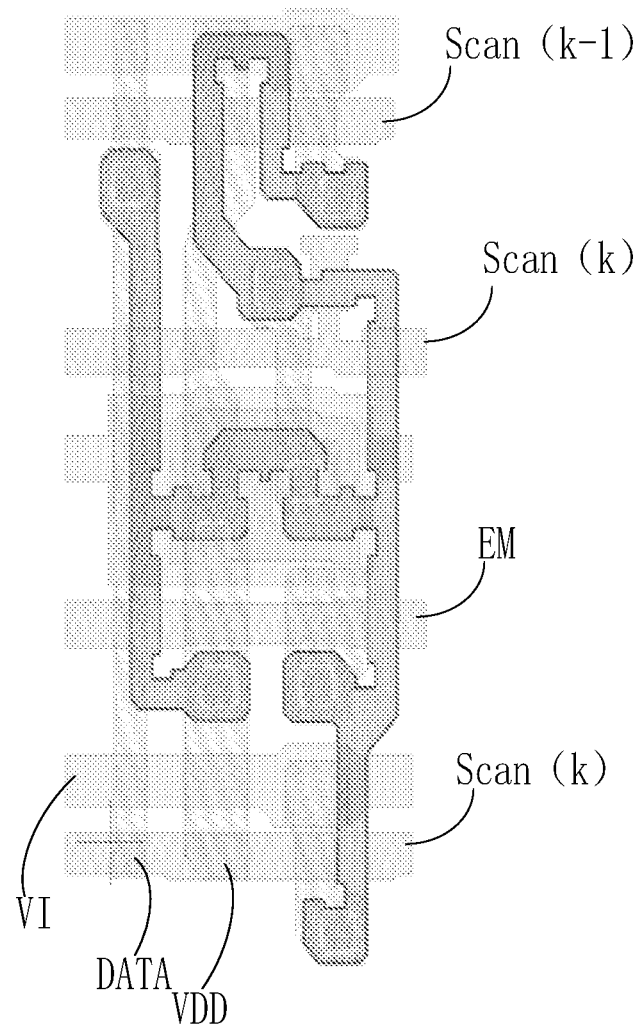
FIG. 3 shows a schematic wiring diagram of the first pixel driving circuit provided by the embodiment of the present disclosure.

FIG. 2 shows a schematic diagram of an equivalent circuit of the first pixel driving circuit provided by an embodiment of the present disclosure, and FIG. 3 shows a schematic wiring diagram of the first pixel driving circuit provided by an embodiment of the present disclosure. As shown in FIG. 2 and FIG. 3, in this embodiment, each of the first pixel driving circuits 601 comprises 9 transistors and 1 capacitor. The 9 transistors comprise a first transistor T1, a second transistor T2, a third transistor T3, a fourth transistor T4, a fifth transistor T5, a sixth transistor T6, a seventh transistor T7, an eighth transistor T8, a ninth transistor T9, and a capacitor C.

One end of a source or a drain of the first transistor T1 is electrically connected to one end of a source or a drain of the fifth transistor T5; another end of the source or the drain of the first transistor T1 is electrically connected to one end of a source or a drain of the sixth transistor T6; and a gate of the first transistor T1 is electrically connected to a node Q.

One end of a source or a drain of the second transistor T2 is connected to a data signal Data; another end of the source or the drain of the second transistor T2 is electrically connected to one end of the source or the drain of the first transistor T1; and a gate of the second transistor T2 is connected to a scan signal Scan(k), the scan signal Scan(k) is, for example, input from a k-th scan line of the first display area 10, wherein, k is an integer greater than 1.

One end of a source or a drain of the third transistor T3 is connected to a reset signal VI; another end of the source or the drain of the third transistor T3 is electrically connected to one end of a source or a drain of the fourth transistor T4; and a gate of the third transistor T3 is connected to a scan signal Scan(k−1), wherein the scan signal Scan(k−1), for example, is input from a (k−1)-th scan line of the first display area 10.

One end of the source or the drain of the fourth transistor T4 is electrically connected to another end of the source or the drain of the third transistor T3; another end of the source or the drain of the fourth transistor T4 is electrically connected to the node Q; and a gate of the fourth transistor T4 is connected to the scan signal Scan(k−1).

One end of the source or the drain of the fifth transistor T5 is electrically connected to one end of the source or the drain of the first transistor T1; another end of the source or the drain of the fifth transistor T5 is connected to a power signal VDD; and a gate of the fifth transistor T5 is connected to an enable signal EM.

One end of the source or the drain of the sixth transistor T6 is electrically connected to another end of the source or the drain of the first transistor T1; another end of the source or the drain of the sixth transistor T6 is electrically connected to a node P; and a gate of the sixth transistor T6 is connected to the enable signal EM.

One end of a source or a drain of the seventh transistor T7 is connected to the reset signal VI; another end of the source or the drain of the seventh transistor T7 is electrically connected to the node P; and a gate of the seventh transistor T7 is connected to the scan signal Scan(k).

One end of a source or a drain of the eighth transistor T8 is electrically connected to the node Q; another end of the source or the drain of the eighth transistor T8 is electrically connected to one end of a source or a drain of the ninth transistor T9; and a gate of the eighth transistor T8 is connected to the scan signal Scan(k).

One end of the source or the drain of the ninth transistor T9 is electrically connected to another end of the source or the drain of the eighth transistor T8; another end of the source or the drain of the ninth transistor T9 is electrically connected to one end of the source or the drain of the sixth transistor T6; and a gate of the ninth transistor T9 is connected to the scan signal Scan(k).

One end of the capacitor C is connected to the power signal VDD; and another end of the capacitor C is electrically connected to the node Q.

The node P is used to output an electrical signal to a pixel unit electrically connected to the first pixel driving circuit, and the pixel unit is, for example, an OLED.

Figure 4:
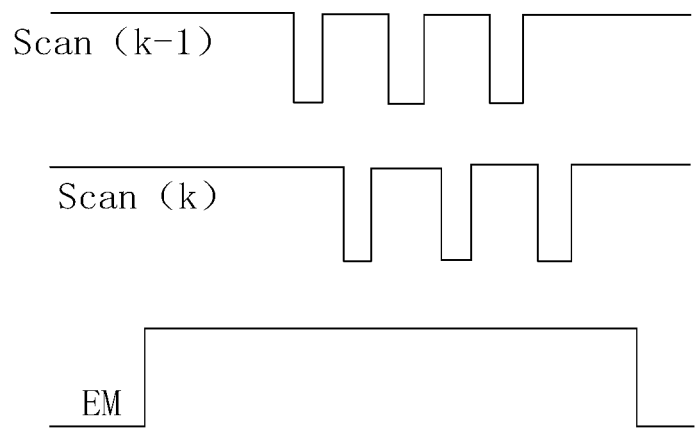
FIG. 4 shows a schematic waveform diagram of two adjacent scan signals and an EM signal.

FIG. 4 shows a schematic waveform diagram of two adjacent scan signals and the EM signal. As shown in FIG. 2 and FIG. 4, in this embodiment, each first pixel driving circuit of the first display area 10 is controlled by the scan signal Scan(k−1), the scan signal Scan(k), and the EM signal. A difference between Scan(k−1) and Scan(k) is half a cycle. The scan signal Scan(k−1) controls the third transistor T3 and the fourth transistor T4 in the first pixel driving circuit of a current row, and the second transistor T2, the seventh transistor T7, the eighth transistor T8, and the ninth transistor T9 in the first pixel driving circuit of a previous row; the scan signal Scan(k) controls the second transistor T2, the seventh transistor T7, the eighth transistor T8, and the ninth transistor T9 in the first pixel driving circuit of the current row, and the third transistor T3 and the fourth transistor T4 in the first pixel driving circuit of a next row. An operating process of each scan signal is: when Scan(k−1) turns on the third transistor T3 and the fourth transistor T4, the reset signal VI resets a potential of the node Q (that is, the gate of the first transistor T1); when Scan(k−1) turns off the third transistor T3 and the fourth transistor T4, the scan signal Scan(k) turns on the second transistor T2, the eighth transistor T8, and the ninth transistor T9, and the data signal Data is written into the node Q through the first transistor T1, the ninth transistor T9, and the eighth transistor T8; when the scan signal Scan(k) turns off the second transistor T2, the eighth transistor T8, and the ninth transistor T9, the enable signal EM turns on the fifth transistor T5 and the sixth transistor T6, and the power signal VDD charges the node P through the fifth transistor T5, the first transistor T1, and the sixth transistor T6.

Figure 5:
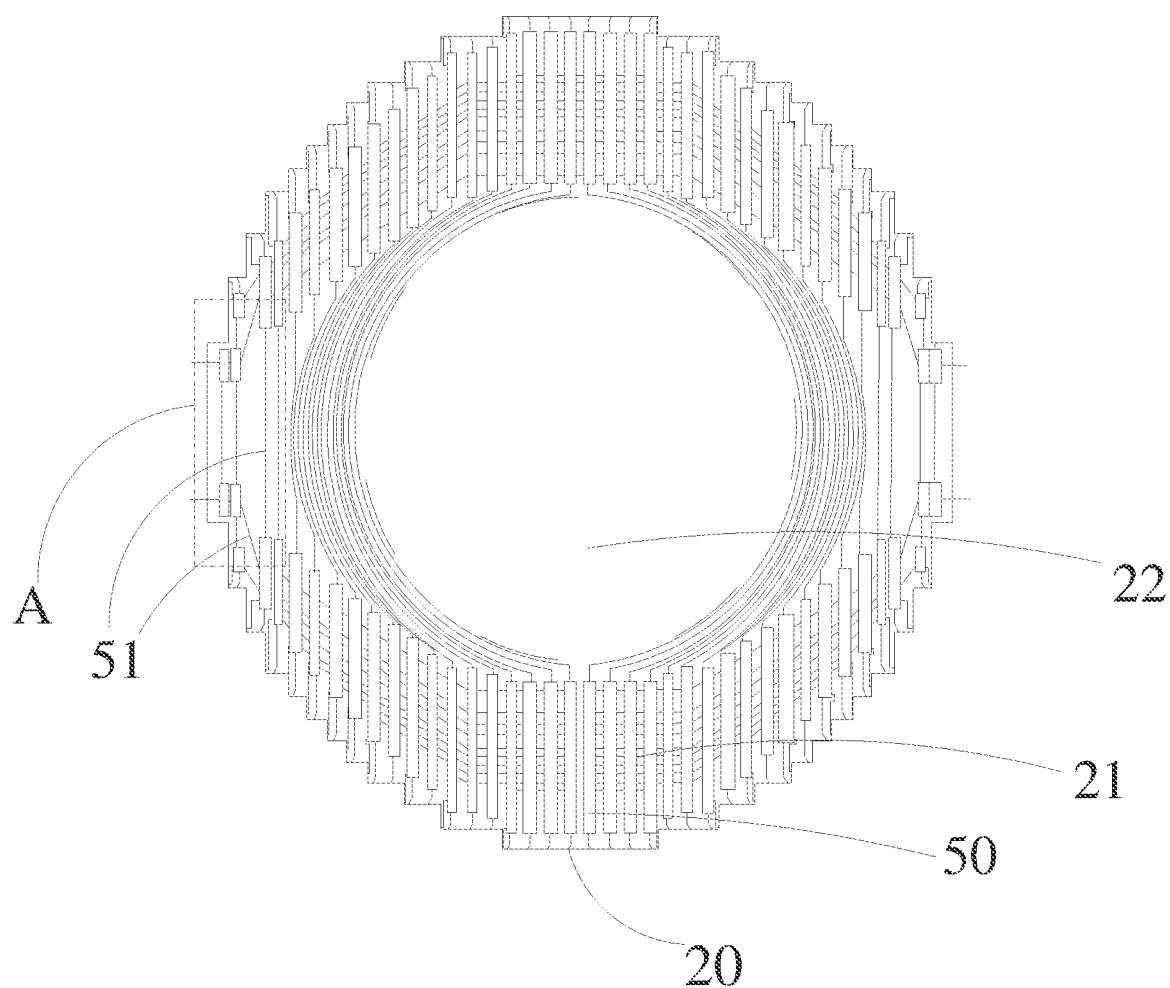
FIG. 5 shows a schematic structural diagram of a second display area.
Figure 6:
FIG. 6 shows a schematic structural diagram of a second pixel driving circuit island.

FIG. 5 shows a schematic structural diagram of the second display area, and FIG. 6 shows a schematic structural diagram of a second pixel driving circuit island. As shown in FIG. 1, FIG. 5, and FIG. 6, the second display area 20 comprises a display transition area 21 and a display transmitting area 22. The display transition area 21 is located at a periphery of the display transmitting area 22. A periphery of the display transition area 21 is the first display area 10, the display transmitting area 22 has a circular shape or a structure similar to a circle, and the display transition area 21 has a ring shape or a ring-like structure. In the second display area 20, a plurality of second pixel driving circuit islands 50 and various signal lines 51 are collectively arranged in the display transition area 21, and each second pixel driving circuit island 50 comprises a plurality of second pixel driving circuits 602 arranged in an array. A number of the second pixel driving circuits 602 comprised in two adjacent second pixel driving circuit islands 50 may be same or different. The signal lines 51 comprise, for example, a data line, a reset signal line, a scan line, a power line, an enable signal line, and the like. Further, the display transmitting area 22 is not provided with the second pixel driving circuit, and the display transmitting area 22 may be provided with transparent wires electrically connected to the second pixel driving circuits 602 (not shown in the figure), since the second pixel driving circuit 602 is not provided in the display transmitting area 22, light transmittance of the display transmitting area 22 can be further increased, and a light sensing quality of the light sensing element can be improved.

Preferably, each of the second pixel driving circuit islands 50 in the display transition area 21 is arranged symmetrically left and right and symmetrically up and down.

In this embodiment, each second pixel driving circuit 602 has a structure similar to that of the first pixel driving circuit 601, and also comprises 9 thin film transistors and 1 capacitor. In this embodiment, same parts are not repeated here. A difference is that the gate of the seventh transistor T7 in the second pixel driving circuit 602 is connected to a scan signal Scan(k+1), wherein the scan signal Scan(k+1), for example, is input after being transmitted to the second display area 20 through a (k+1)-th scan line of the first display area 10. The scan signal Scan(k) and the scan signal Scan(k+1) are different by half a period. The node P is used to output an electrical signal to at least one pixel unit electrically connected to the second pixel driving circuit, preferably, the node P is used to output an electrical signal to two pixel units electrically connected to the second pixel driving circuit 602.

Figure 7:
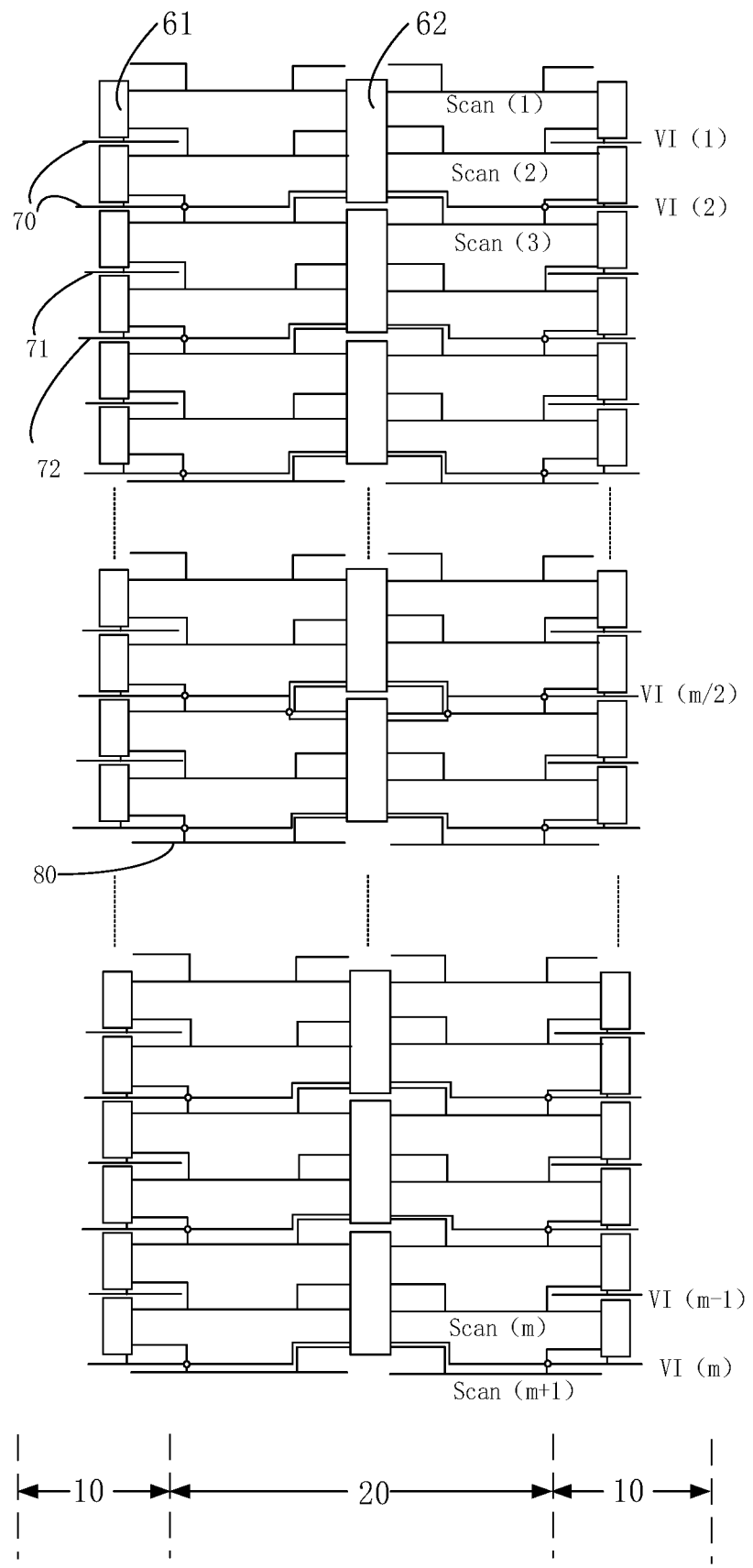
FIG. 7 shows a schematic structural diagram of a display panel provided by an embodiment of the present disclosure.

FIG. 7 shows a schematic structural diagram of a display panel provided by an embodiment of the present disclosure. As shown in FIG. 1 to FIG. 7, a plurality of first pixel driving circuit rows 61 are sequentially arranged from one side of the first display area 10, and each of the first pixel driving circuit row 61 comprises a plurality of first pixel driving circuits 601 arranged in sequence at intervals; a plurality of second pixel driving circuit rows 62 are arranged in sequence from one side of the second display area 20, and each of the second pixel driving circuit rows 62 comprises a plurality of second pixel driving circuits 602 arranged sequentially at intervals. Preferably, a number of the first pixel driving circuit rows 61 is twice a number of the second pixel driving circuit rows 62, that is, in a circuit connection relationship, every two first pixel driving circuit rows may correspond to one second pixel driving circuit row 62. In other embodiments of the present disclosure, the number of the first pixel driving circuit rows 61 may also be other integer multiples of the number of the second pixel driving circuit rows 62, for example, triple, quadruple, etc. It should be noted that, FIG. 7 is an illustration made to facilitate description of the circuit connection relationship between the first pixel driving circuit rows 61 and the second pixel driving circuit rows 62, and it does not represent a row width of the second pixel driving circuit rows in an actual circuit is twice that of the first pixel driving circuit rows 61. In addition, FIG. 7 shows a total of 16 first pixel driving circuit rows 61 and 8 second pixel driving circuit rows 62, but the number of the first pixel driving circuit rows 61 in the present disclosure can also be less or greater than the number of the first pixel driving circuit rows 61 shown in the figure, and the number of the second pixel driving circuit rows 62 of the present disclosure can also be less than or greater than the number of the second pixel driving circuit rows 62 shown in the figure. This embodiment does not limit this.

In this embodiment, the display panel further comprises pixel units (not shown in the figure) electrically connected to the pixel driving circuits, and the pixel units comprise first pixel units located in the first display area 10 and second pixel units located in the second display area 20. Each of the first pixel driving circuits drives one of the first pixel units, and each of the second pixel driving circuits drives two of the pixel drive units. An arrangement density of the first pixel units in the first display area 10 and an arrangement density of the second pixel units in the second display area 20 may be same. Preferably, each pixel unit comprises an anode, a cathode, and a light-emitting portion arranged between the anode and the cathode; the first pixel units comprise red pixel units, green pixel units, and blue pixel units; the second pixel units comprise red pixel units, green pixel units, and blue pixel units; a size of the light-emitting portions of the second pixel units of a same color may less than a size of the light-emitting portions of the first pixel units of the same color, thereby further improving a light transmittance of the second display area 20.

In this embodiment, a plurality of reset signal lines 70 are sequentially arranged from one side of the first display area 10, and each first pixel driving circuit in each first pixel driving circuit row 61 is electrically connected to a same reset signal line 70 correspondingly, and each second pixel driving circuit in each second pixel driving circuit row 62 is electrically connected to a same reset signal line 70 correspondingly. A number of the plurality of reset signal lines 70 is equal to the number of the first pixel driving circuit row 61, and the first pixel driving circuit rows 61 and the plurality of reset signal lines 70 are electrically connected in one-to-one correspondence. Wherein, the reset signal lines 70 comprise first reset signal lines 71 and second reset signal lines 72. Each first reset signal line 71 is disconnected in the display transition area of the second display area 20, and is only electrically connected to the first pixel driving circuits of the first display area 10; each second reset signal line 72 crosses the first display area 10 and the second display area 20, and is electrically connected to one pixel driving circuit row 61 and at least one of the second pixel driving circuit rows 62. The reset signal line design provided in the present disclosure realizes that each reset signal line 70 electrically connected to the second pixel driving circuits of the second display area 20 is correspondingly connected to only one row of the first pixel driving circuits of the first display area 10 at the same time by merely connecting a part of the reset signal lines to the first pixel driving circuits of the second display area 20, so that resistance and capacitance loading of the first display area 10 and the second display area 20 coincide, a phenomenon that a plurality of reset signal lines of the first display area 10 are connected to one of the reset signal lines of the second display area 20 is prevented, and a lateral moire phenomenon generated by the display panel in a low gray-scale mode is prevented, thereby improving a display effect of the display panel. Like the foregoing description of the first pixel driving circuit rows 61 and the second pixel driving circuit rows 62, the present disclosure does not limit numbers of the first reset signal lines 71 and the second reset signal lines 72, and actual numbers of the first reset signal lines 71 and the second reset signal lines 72 may be less or greater than the number of the first reset signal lines 71 and the second reset signal lines 72 shown in the figure.

In this embodiment, based on a structure in which the second pixel driving circuits of the second display area 20 are symmetrical up and down, the second pixel driving circuits are provided with even rows in total. For example, the second pixel driving circuits 602 are provided with 2n rows sequentially from one side of the second display area 20, the second reset signal lines 72 are provided with 2n rows sequentially from one side of the second display area 20, and n is an integer greater than or equal to one.

In this embodiment, m reset signal lines 70 corresponding to the plurality rows of first pixel driving circuits are sequentially provided from one side of the first display area 10, and the first reset signal lines 71 and the second reset signal lines 72 among the m reset signal lines 70 are alternately arranged in sequence.

In this embodiment, the number of rows of the first pixel driving circuits is twice the number of rows of the second pixel driving circuits, that is, the number of rows of the first pixel driving circuits is twice the number of lines of the second reset signal lines 72, that is 4n. Since one second reset signal line 72 corresponds to one row of the first pixel driving circuits, the number of the first reset signal lines 71 and the number of the second reset signal lines 72 are equal, both are 2n, m=4n.

Wherein, one of the plurality of second reset signal lines 72 is electrically connected to one row of the first pixel driving circuits and two rows of the second pixel driving circuits; each of other second reset signal lines 72 is correspondingly electrically connected to one row of the first pixel driving circuits and one row of the second pixel driving circuits. That is, one of the 2n second reset signal lines 72 is electrically connected to two rows of the second pixel driving circuits, and each of remaining second reset signal lines 72 of the 2n second reset signal lines 72 is electrically connected to one row of the second pixel driving circuits. Preferably, the one second reset signal line 72 electrically connected to the two rows of second pixel driving circuits is a (m/2)-th one of the m reset signal lines, and the (m/2)-th second reset signal line is respectively electrically connected to anode reset terminals of the second pixel driving circuits in one row and capacitance reset terminals of the second pixel driving circuits in another row, and the two rows of second pixel driving circuits electrically connected to the (m/2)-th second reset signal line 72 are the second pixel driving circuits in a n-th row and the second pixel driving circuits in a (n+1)-th row.

In this embodiment, the (n+1)-th row of the plurality of rows of second pixel driving circuits is electrically connected to two second reset signal lines 72, and each row of other rows of second pixel driving circuits is electrically connected to one second reset signal line 72, and the number of the second reset signal lines 72 is equal to the number of rows of the second pixel driving circuits.

In this embodiment, a plurality of scan lines 80 are sequentially arranged from one side of the first display area 10, and each first pixel driving circuit in each first pixel driving circuit row 61 is electrically connected to two adjacent scan lines 80 correspondingly, and each second pixel driving circuit in each second pixel driving circuit row 62 is electrically connected to three adjacent scan lines 80 correspondingly.

As shown in FIG. 7, a number of the scan lines is one more than the number of the reset signal line 70, that is, the number of the scan line 80 is m+1, and the scan lines 80 cross the first display area 10 and the second display area 20, specifically cross the first display area 10 and the display transition area 21 of the second display area 20.

In the first display area 10, an a-th reset signal line 70 of the m reset signal lines 70 is arranged corresponding to an (a+1)-th scan line 80 of m+1 scan lines, 1≤a≤m, and a is an integer.

In this embodiment, the m reset signal lines comprise a first reset signal line VI (1), a second reset signal line VI (2) . . . an (m/2)-th reset signal line VI (m/2) . . . an (m−1)-th reset signal line VI (m−1), an m-th reset signal line VI (m) arranged sequentially from one side of the first display area 10; the m+1 scan lines comprise a first scan line Scan(1), a second scan line Scan(2), and a third scan line Scan(3) . . . an m-th scan line Scan(m), an (m+1)-th scan line Scan(m+1) arranged sequentially from one side of the first display area 10.

In this embodiment, among the m reset signal lines in the first display area 10, odd numbers of the reset signal lines 70 are the first reset signal lines 71, and even numbers of the reset signal lines 70 are the second reset signal line 72; wherein, in the second display area 20, the even numbers of the reset signal lines 70 and odd numbers of the scan lines 80 are arranged correspondingly. Specifically, a b-th reset signal line 70 in the first display area 10 is the second reset signal line 72, and the b-th reset signal line 70 of the m reset signal lines 70 in the second display area 20 corresponds to a (b+1)-th scan line 80 of the m+1 scan lines, and b is an even number greater than or equal to 2 and less than or equal to m, that is, any one of the second reset signal lines 72 corresponds to a same scan line 80 in the first display area 10 and the second display area 20.

Figure 8:
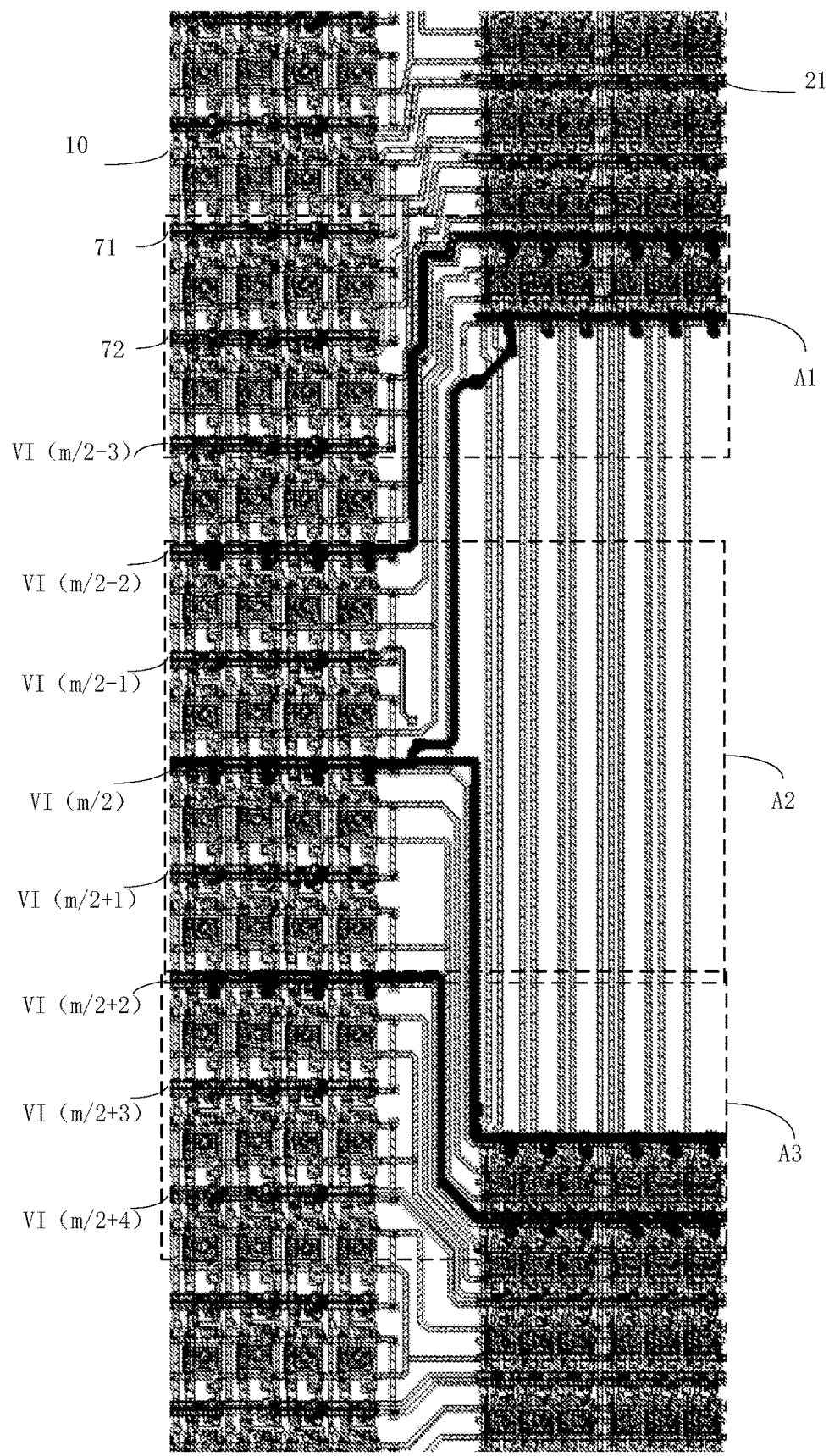
FIG. 8 is a schematic structural diagram of the display panel at A in FIG. 5.
Figure 9A:
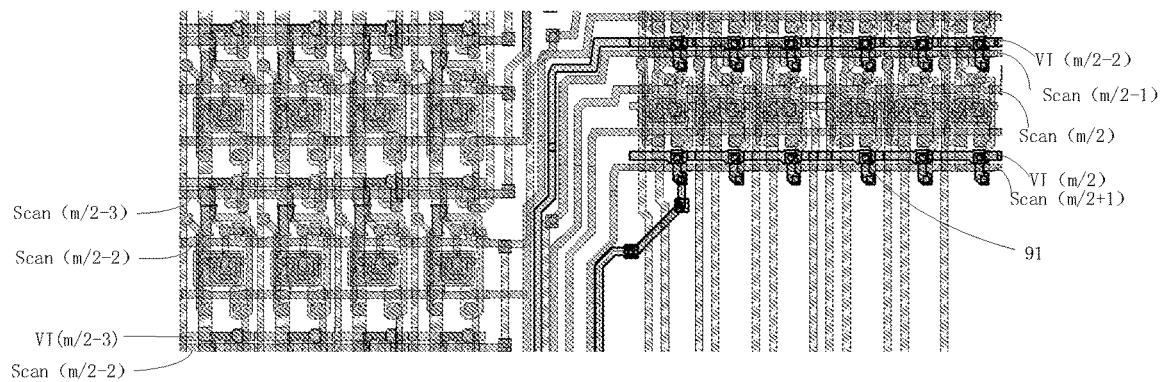
FIGS. 9a-9c are respectively enlarged schematic diagrams of structures at A1, A2, and A3 in FIG. 8.
Figure 9B:
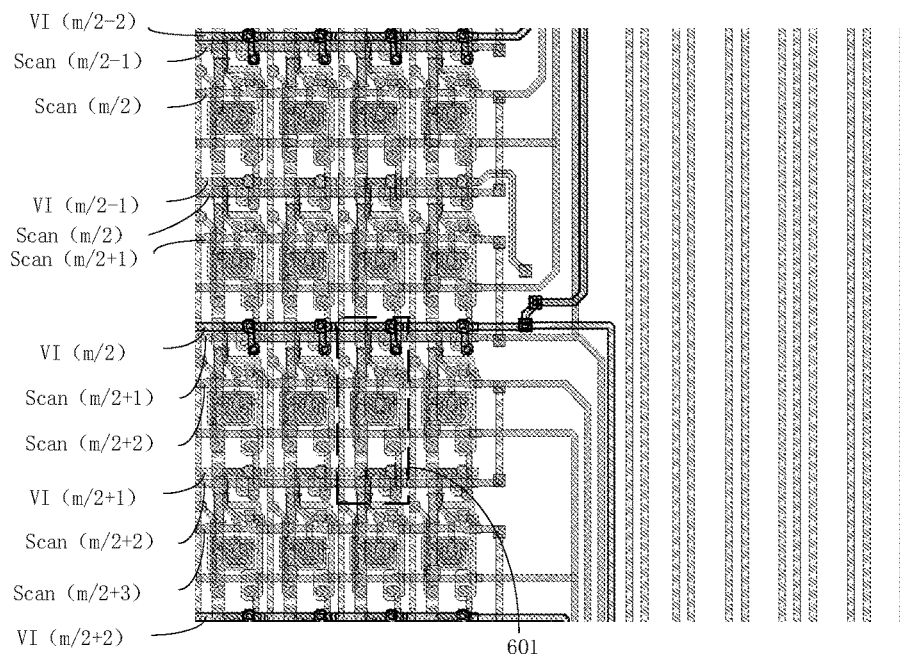
Figure 9C:
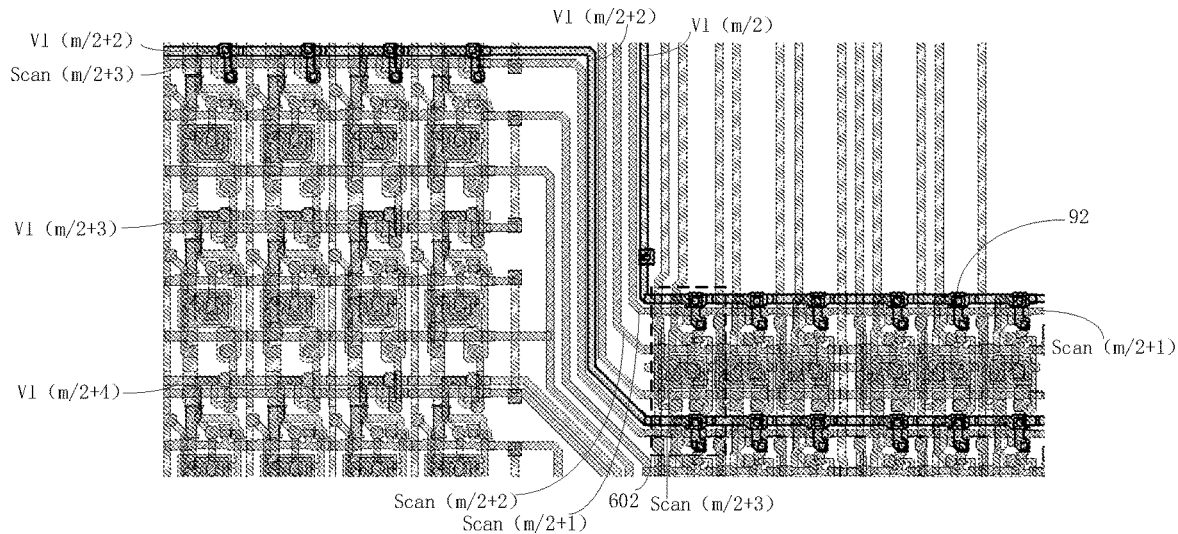

FIG. 8 is a schematic structural diagram of the display panel at A in FIG. 5, and FIGS. 9a to 9c are enlarged schematic diagrams of structures at A1, A2, and A3 in FIG. 8, respectively. As shown in FIGS. 7, 8, and 9a-9c, the display panel is sequentially provided with m reset signal lines 70 in a one-to-one correspondence with the plurality of rows of first pixel driving circuits from one side of the first display area 10. The m reset signal lines comprise first reset signal lines 71 and second reset signal lines 72 alternately arranged in sequence, the first reset signal lines 71 are disconnected in the display transition area 21, and the second reset signal lines 72 cross the first display area 10 and the display transition area 21, wherein, assuming that n is an integer greater than 2, then m=4n>8, and middle 8 reset signal lines of the m reset signal lines 70 are a reset signal line VI (m/2−3), a reset signal line VI (m/2−2), a reset signal line VI (m/2−1), a reset signal line VI (m/2), a reset signal line VI (m/2+1), a reset signal line VI (m/2+2), a reset signal line VI (m/2+3), and a reset signal line VI (m/2+4) respectively. The reset signal line VI (m/2−3) corresponds to a scan line Scan (m/2−2), and the reset signal line VI (m/2−2) corresponds to a scan line Scan (m/2−1), the reset signal line VI (m/2−1) corresponds to a scan line Scan (m/2), the reset signal line VI (m/2) corresponds to a scan line Scan (m/2+1), the reset signal line VI (m/2+1) corresponds to a scan line Scan (m/2+2), and the reset signal line VI (m/2+2) corresponds to a scan line Scan (m/2+3) . . . wherein, the reset signal line VI (m/2−3), the reset signal line VI (m/2−1), the reset signal line VI (m/2+1), and the reset signal line VI (m/2+3) are the first reset signal line 71, the reset signal line VI (m/2−2), the reset signal line VI (m/2), the reset signal line VI (m/2+2), and the reset signal line VI (m/2+4) are the second reset signal lines 72. The reset signal line VI (m/2) extends from the first display area 10 to upper and lower sides of the display transition area 21, and is respectively electrically connected to an upper anode reset terminal 91 and a lower capacitor reset terminal 92, each of the second pixel driving circuits 602 of the display transition area 21 is up and down symmetrical with respect to the reset signal line VI (m/2), and the up and down symmetry refers to the up and down symmetry of a basic circuit structure. The reset signal line VI(m/2) corresponds to a same scan line in the first display area 10 and the display transition area 21, and is the scan line Scan(m+1). At the same time, since the number of the reset signal lines 70 directly corresponds to the number of rows of the first pixel driving circuits 601, half of the number of the reset signal lines 70 directly corresponds to the number of rows of the second pixel driving circuits 602, that is, the first pixel driving circuits 601 in an (m/2−3)-th row and an (m/2−2)-th row correspond to the second pixel driving circuits 602 in an (m/4−1)-th row. Similarly, the first pixel driving circuits 601 in an (m/2−1)-th row and an (m/2)-th row correspond to the second pixel driving circuits 602 in an (m/4)-th row, that is, the first pixel driving circuits 601 in every two adjacent rows correspond to one row of the second pixel driving circuits 602.

Embodiment Two

Figure 10:
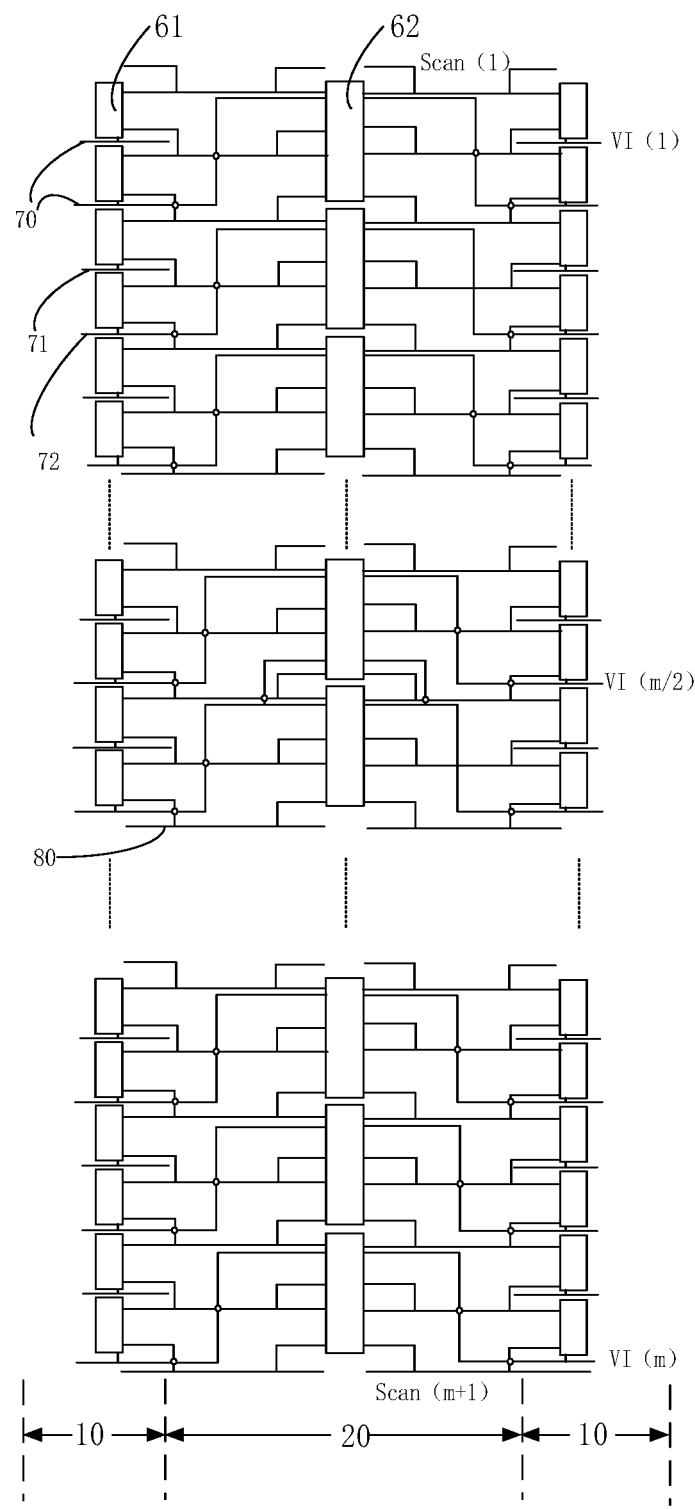
FIG. 10 shows a schematic structural diagram of a display panel provided by an embodiment of the present disclosure.

FIG. 10 shows a schematic structural diagram of a display panel provided by an embodiment of the present disclosure. As shown in FIG. 10, a structure of the display panel provided in the second embodiment of the present disclosure is similar to the structure of the display panel in the first embodiment. In this embodiment, in the m reset signal lines in the first display area 10, odd numbers of the reset signal lines 70 are the first reset signal lines 71, and even numbers of the reset signal lines 70 are the second reset signal line 72; wherein, in the second display area 20, even numbers of the reset signal lines 70 and odd numbers of the scan lines 80 are arranged correspondingly. In this embodiment, same parts will not be repeated. A difference is that, in the first display area 10, the b-th reset signal line 70 of the m reset signal lines 70 is the second reset signal line 72. The b-th reset signal line 70 of the m reset signal lines 70 corresponds to a (b−1)-th scan line 80 among the m+1 scan lines in the second display area 20, wherein b is an even number greater than or equal to 2 and less than or equal to m. That is to say, any one of the second reset signal lines 72 is set in the first display area 10 and the second display area 20 in a staggered row relative to the scan line 80, and the scan lines 80 corresponding to the second reset signal line 72 in the first display area 10 and the second display area 20 are different.

Embodiment Three

Figure 11:
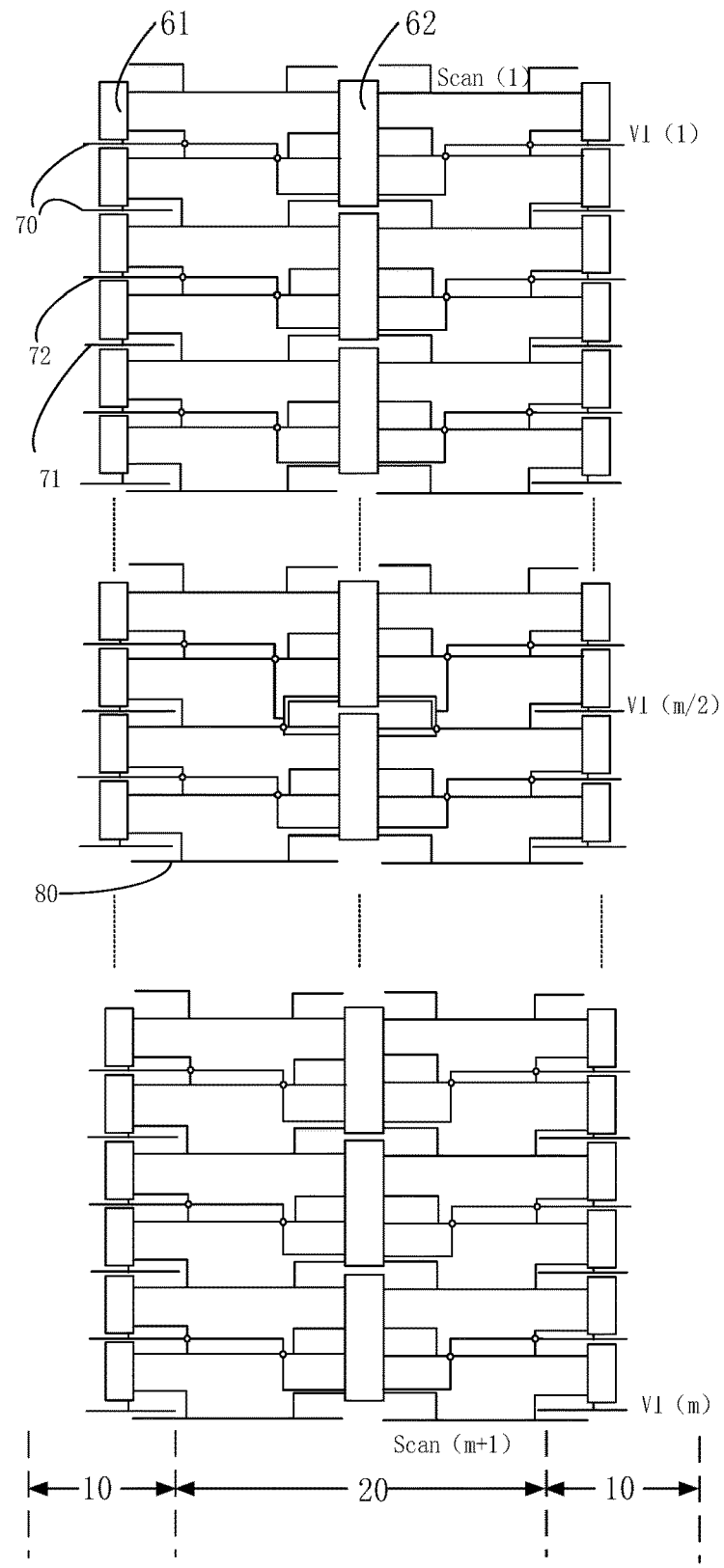
FIG. 11 shows a schematic structural diagram of a display panel provided by an embodiment of the present disclosure.

FIG. 11 shows a schematic structural diagram of a display panel provided by an embodiment of the present disclosure. As shown in FIG. 11, a structure of the display panel provided in the third embodiment of the present disclosure is similar to the structure of the display panel in the first embodiment. Same parts will not be repeated. A difference is that, in this embodiment, among the m reset signal lines in the first display area 10, odd numbers of the reset signal lines 70 are the second reset signal lines 72, even numbers of the reset signal lines 70 are the first reset signal lines 71; wherein, in the second display area 20, the odd numbers of the reset signal lines 70 correspond to the odd numbers of the scan lines 80. Specifically, the b-th reset signal line 70 in the first display area 10 is the second reset signal line 72, and the b-th reset signal line 70 of the m reset signal lines 70 in the second display area 20 corresponds to a (b+2)-th scan line 80 of the m+1 scan lines, wherein 1≤b<m, and b is an odd number, that is, any one of the second reset signal lines 72 in the first display area 10 and the second display area 20 is set in a staggered row relative to the scan line 80, and the scan lines 80 corresponding to each second rest signal line 72 in the first display area 10 and the second display area 20 are different.

Embodiment Four

Figure 12:
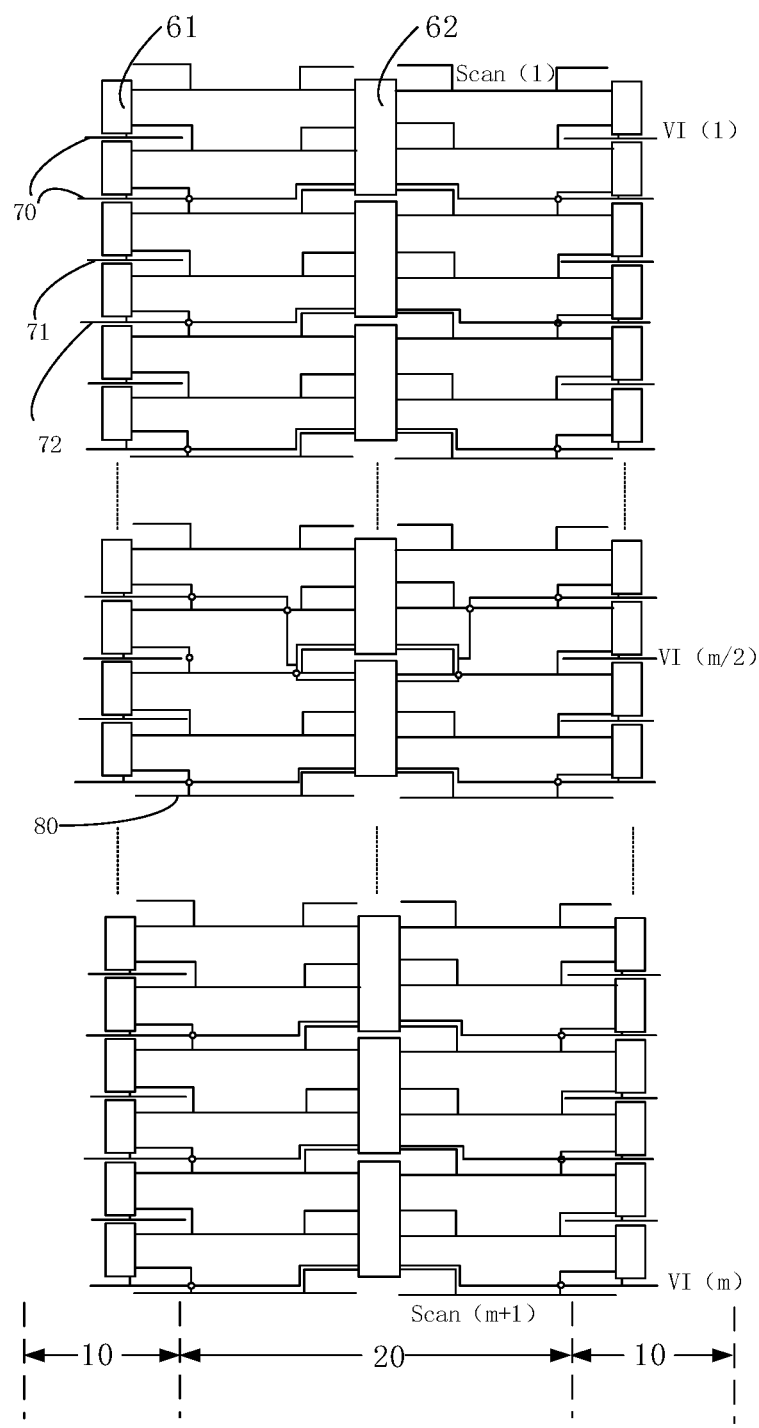
FIG. 12 shows a schematic structural diagram of a display panel provided by an embodiment of the present disclosure.

FIG. 12 shows a schematic structural diagram of a display panel provided by an embodiment of the present disclosure. As shown in FIG. 12, a structure of the display panel provided in the fourth embodiment of the present disclosure is similar to the structure of the display panel in the first embodiment. Same parts will not be repeated. A Difference is that an arrangement of middle 4 reset signal lines in the m reset signals is different from an arrangement of other reset signal lines. Specifically, the middle 4 reset signal lines among the m reset signal lines are (m−2)/2−th, m/2−th, (m+2)/2−th, and (m+4)/2-th respectively. Wherein, the (m−2)/2-th reset signal line 70 and the (m+4)/2-th reset signal line 70 are one type of the first reset signal line 71 and the second reset signal line 72; the m/2-th reset signal line 70 and the (m+2)/2-th reset signal line 70 are another type of the first reset signal line 71 and the second reset signal line 72. Preferably, the (m−2)/2-th reset signal line 70 and the (m+4)/2-th reset signal line 70 are the second reset signal lines 72, and the m/2-th reset signal line and the (m+2)/2-th reset signal line 70 are the first reset signal lines 71. Further, the (m−2)/2-th reset signal line 70 corresponds to the (m+2)/2-th scan line 80 in the second display area 20, that is, the (m−2)/2-th reset signal line 70 is set in the first display area 10 and the second display area 20 in two staggered rows relative to the scan line 80, and any one of the other second reset signal lines 72 corresponds to a same scan line in the first display area 10 and the second display area 20. It should be noted that, when n=1 and m=4, the middle four reset signal lines 70 are all reset signal lines 70.

Embodiment Five

Figure 13:
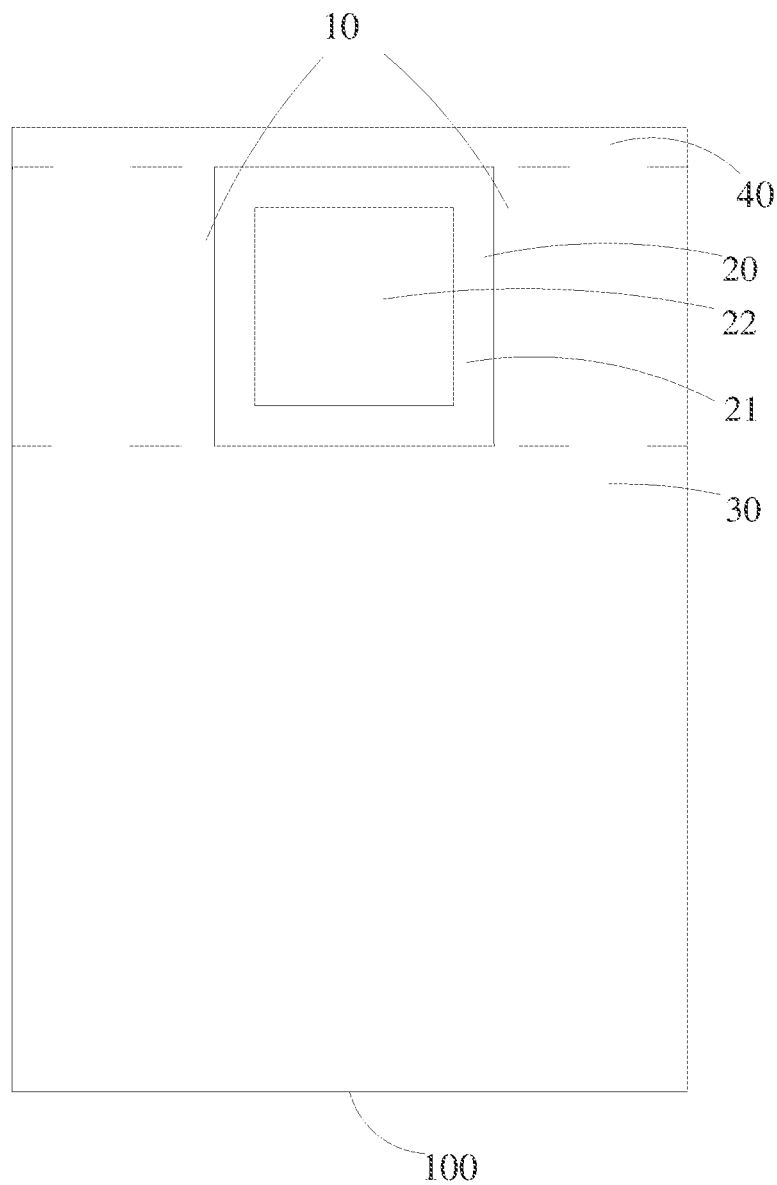
FIG. 13 shows a schematic structural diagram of another display substrate provided by an embodiment of the present disclosure.
Figure 14:
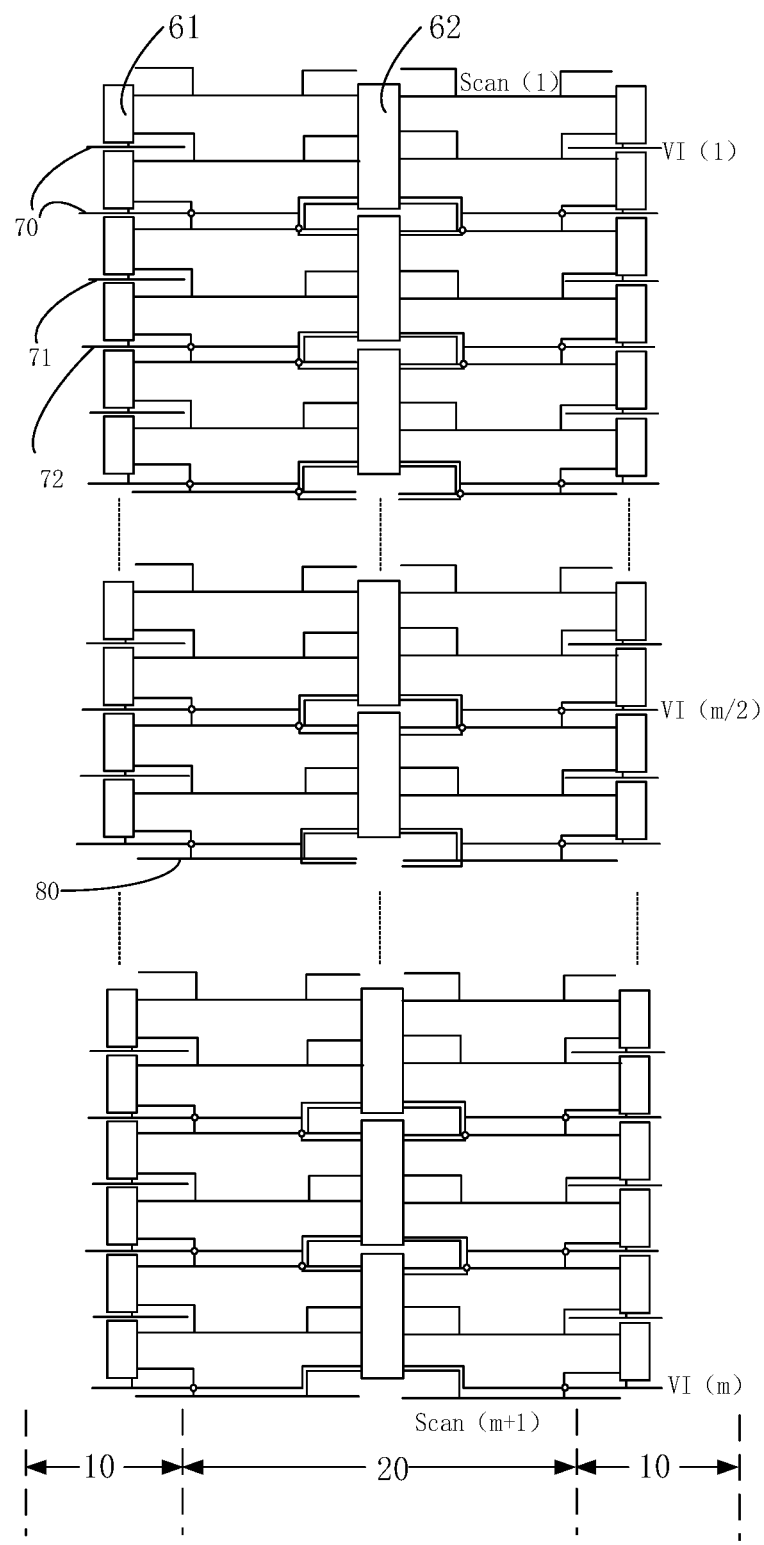
FIG. 14 shows a schematic structural diagram of a display panel provided by an embodiment of the present disclosure.

FIG. 13 shows a schematic structural diagram of another display substrate 100 provided by an embodiment of the present disclosure. FIG. 14 shows a schematic structural diagram of a display panel provided by an embodiment of the present disclosure. As shown in FIGS. 13 and 14, a structure of the display panel provided in the fifth embodiment of the present disclosure is similar to the structure of the display panel in the first embodiment. Specifically, from one side of the first display area 10, m reset signal lines 70 and m+1 scan lines 80 are sequentially arranged on the display panel, the scan lines 80 cross the first display area 10 and the second display area 20, and the second display area 20 comprises a display transition area 21 and a display transmitting area 22, wherein first reset signal lines 71 and second reset signal lines 72 of the m reset signal lines are alternately arranged in sequence, and an a-th of the m reset signal lines 70 in the m reset signal lines of the first display area 10 and the second display area 20 corresponds to an (a+1)-th one of the m+1 scan lines 80, where m=4n, 2≤a≤m, and a is an even number. In this embodiment, same parts will not be repeated. A difference is that any one of the plurality of second reset signal lines 72 is electrically connected to one row of the first pixel driving circuits and two rows of the second pixel driving circuits correspondingly. In the second display area 20, the plurality of second reset signal lines 72 are respectively electrically connected to anode reset terminals of one row of the second pixel driving circuit and capacitance reset terminals of the second pixel driving circuit of another row. The second display area 20 is a rectangular area, and the rectangular area may be a rectangle or a rectangle-like area.

Embodiment Six

Another aspect of the embodiments of the present disclosure further provides a display device. The display device comprises a light sensing element and the display panel in any one of the above embodiments, and the light sensing element is disposed on one side of the display panel corresponding to the second display area, and the light sensing element may be a camera or a light sensor.

The present disclosure provides a display panel and a display device. The display panel comprises the display substrate comprising the first display area and the second display area adjacent to the first display area; the plurality row of first pixel driving circuits in the first display area and the plurality rows of second pixel driving circuits in the second display area, wherein the number of rows of the first pixel driving circuits is greater than the number of rows of the second pixel driving circuits; the plurality of rest signal lines are electrically connected with the plurality rows of the first pixel driving circuits in a one-to-one correspondence, and the plurality of reset signal lines comprises the plurality of first reset signal lines and the plurality of second reset signal lines, each of the first reset signal lines is electrically connected to only one row of the first pixel driving circuits, and each of the second reset signal lines is electrically connected to one row of the first pixel driving circuits and at least one row of the second pixel driving circuits. In the display panel and the display device disclosed in the present disclosure, each of the first reset signal lines is electrically connected to only one row of the first pixel driving circuits, and each of the second reset signal lines is electrically connected to one row of the first pixel driving circuits and at least one row of the second pixel driving circuits, so that the resistance-capacitance loading of the first display area and the second display area are consistent, the phenomenon that the plurality of reset signal lines of the first display area are connected to one of the reset signal lines of the second display area is prevented, and the lateral moire phenomenon generated by the display panel in the low gray-scale mode is prevented, thereby improving the display effect of the display panel and the display device.

The above is a detailed introduction to a display panel and a display device provided by the embodiments of the present disclosure. Specific examples are used in this article to illustrate principles and implementations of the present disclosure. The descriptions of the above embodiments are only used to help understand the present disclosure. At the same time, for those skilled in the art, according to the idea of the present disclosure, there will be changes in the specific implementation and the scope of the present disclosure. In summary, the content of this specification should not be construed as a limitation to the present disclosure.

What is claimed is:

1. A display panel, comprising:
a display substrate comprising a first display area and a second display area adjacent to the first display area;
a pixel unit comprising first pixel units located in the first display area and second pixel units located in the second display area, wherein the first display area surrounds the second display area;
a pixel driving circuit comprising a plurality of first pixel driving circuits electrically connected to the first pixel units and a plurality of second pixel driving circuits electrically connected to the second pixel units, wherein the plurality of first pixel driving circuits are arranged in a plurality of rows of first pixel driving circuits in the first display area, and the plurality of second pixel driving circuits are arranged in a plurality of rows of second pixel driving circuits in the second display area; and
a plurality of reset signal lines electrically connected to the plurality of rows of the first pixel driving circuits in a one-to-one correspondence,
wherein each of the rows of the first pixel driving circuits is electrically connected to a same reset signal line, and each of the rows of the second pixel driving circuits is electrically connected to a same reset signal line, and
wherein the plurality of reset signal lines comprise a plurality of first reset signal lines and a plurality of second reset signal lines, each of the first reset signal lines is electrically connected to only one row of the first pixel driving circuits; and each of the second reset signal lines is electrically connected to one row of the first pixel driving circuits and at least one row of the second pixel driving circuits.

2. The display panel according to claim 1, wherein the second display area comprises a display transmitting area and a display transition area disposed between the display transmitting area and the display transition area, and
wherein the first reset signal lines cross the first display area and are disconnected at the display transition area; and the plurality of second pixel driving circuits are arranged in the display transition area, and the second reset signal lines cross the first display area and the display transition area.

3. The display panel according to claim 2, wherein the number of rows of the first pixel driving circuits is at least twice the number of rows of the second pixel driving circuits.

4. The display panel according to claim 3, wherein each of the first pixel driving circuits drives one first pixel unit, and each of the second pixel driving circuits drives at least two second pixel units.

5. The display panel according to claim 4, wherein the second pixel driving circuits are sequentially provided with 2n rows from one side of the second display area, and n is an integer greater than or equal to one.

6. The display panel according to claim 5, wherein one of the plurality of second reset signal lines is electrically connected to one row of the first pixel driving circuits and two rows of the second pixel driving circuits correspondingly; each of other second reset signal lines is electrically connected to a row of the first pixel driving circuits and a row of the second pixel driving circuits correspondingly.

7. The display panel according to claim 6, wherein the two rows of second pixel driving circuits electrically connected to the one second reset signal line are an n-th row of the second pixel driving circuits and an (n+1)-th row of the second pixel driving circuits.

8. The display panel according to claim 6, wherein one of the plurality rows of second pixel driving circuits is electrically connected to two of the second reset signal lines correspondingly, and each of other plurality rows of second pixel driving circuits is electrically connected to one of the second reset signal lines correspondingly, and a number of the second reset signal lines is equal to the number of rows of the second pixel driving circuits.

9. The display panel according to claim 8, wherein m reset signal lines and m+1 scan lines are arranged sequentially from one side of the first display area, the scan lines cross the first display area and the second display area, wherein an a-th of the m reset signal lines corresponds to an (a+1)-th of the m+1 scan lines in the first display area, wherein m=4n, $1 \leq a \leq m$.

10. The display panel according to claim 9, wherein the first reset signal lines and the second reset signal lines are sequentially arranged alternately from one side of the first display area.

11. The display panel according to claim 10, wherein odd numbers of the m reset signal lines are the first reset signal line, even numbers of the m reset signal lines are the second reset signal lines, and a b-th of the m reset signal lines corresponds to a (b+1)-th of the m+1 scan lines in the second display area, wherein $2 \leq b \leq m$ and b is an even number.

12. The display panel according to claim 10, wherein odd numbers of the m reset signal lines are the first reset signal lines, even numbers of the m reset signal lines are the second reset signal lines, and a b-th of the m reset signal lines corresponds to a (b−1)-th of the m+1 scan lines in the second display area, wherein $2 \leq b \leq m$ and b is an even number.

13. The display panel according to claim 10, wherein middle four of the m reset signal lines are respectively an (m−2)/2-th, an (m/2)-th, an (m+2)/2-th, and an (m+4)/2-th, wherein the (m−2)/2-th reset signal line and the (m+4)/2-th reset signal line are one type of the first reset signal line and the second reset signal line; and the m/2-th reset signal line and the (m+2)/2-th reset signal line are another type of the first reset signal line and the second reset signal line.

14. The display panel according to claim 13, wherein the (m−2)/2-th reset signal line and the (m+4)/2-th reset signal line are the second reset signal lines, wherein the (m−2)/2-th reset signal line corresponds to the (m+2)/2-th scan line in the second display area, and any one of the other second reset signal lines corresponds to a same scan line in the first display area and the second display area.

15. The display panel according to claim 9, wherein odd numbers of the m reset signal lines are the second reset signal lines, even numbers of the m reset signal lines are the first reset signal lines, and a b-th of the m reset signal lines corresponds to a (b+2)-th of the m+1 scan lines in the second display area, wherein $1 \leq b < m$, b is an odd number.

16. The display panel according to claim 5, wherein any one of the plurality of second reset signal lines is electrically connected to one row of the first pixel driving circuits and two rows of the second pixel driving circuits correspondingly.

17. The display panel according to claim 16, wherein from one side of the first display area, m reset signal lines and m+1 scan lines are sequentially arranged in rows, the scan lines cross the first display area and the second display area, wherein the first reset signal lines and the second reset signal lines of the m reset signal lines are sequentially arranged alternately, an a-th of the m reset signal lines corresponds to an (a+1)-th of the m+1 scan lines in the first display area and the second display area, and m=4n, $2 \leq a \leq m$, a is an even number.

18. The display panel according to claim 5, wherein the second display area is a rectangular area or a circular area, and the display transition area is disposed around the display transmitting area.

19. The display panel according to claim 1, wherein an arrangement density of the first pixel units in the first display area is the same as that of the second pixel units in the second display area.

20. A display device, wherein the display device comprises a light sensing element and a display panel, and the display panel comprises: a display substrate comprising a first display area and a second display area adjacent to the first display area, wherein the first display area surrounds the second display area; a pixel unit comprising first pixel units located in the first display area and second pixel units located in the second display area; a pixel driving circuit comprising a plurality of first pixel driving circuits electrically connected to the first pixel units and a plurality of second pixel driving circuits electrically connected to the second pixel units, wherein the plurality of first pixel driving circuits are arranged in a plurality of rows of first pixel driving circuits in the first display area, and the plurality of second pixel driving circuits are arranged in a plurality of rows of second pixel driving circuits in the second display area; and a plurality of reset signal lines electrically connected to the plurality of rows of the first pixel driving circuits in a one-to-one correspondence, wherein each of the rows of the first pixel driving circuits is electrically connected to a same reset signal line, and each of the rows of the second pixel driving circuits is electrically connected to a same reset signal line, and wherein the plurality of reset signal lines comprise a plurality of first reset signal lines and a plurality of second reset signal lines, each of the first reset signal lines is electrically connected to only one row of the first pixel driving circuits; and each of the second reset signal lines is electrically connected to one row of the first pixel driving circuits and at least one row of the second pixel driving circuits, and the light sensing element is disposed on one side of the display panel corresponding to the second display area.

\* \* \* \* \*